(12) United States Patent
Kashiwagi et al.

(10) Patent No.: US 8,373,196 B2
(45) Date of Patent: Feb. 12, 2013

(54) COMPOSITION ENCAPSULATING OPTICAL SEMICONDUCTOR AND OPTICAL SEMICONDUCTOR DEVICE USING SAME

(75) Inventors: Tsutomu Kashiwagi, Annaka (JP); Masanobu Sato, Tokushima (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 533 days.

(21) Appl. No.: 12/716,823

(22) Filed: Mar. 3, 2010

(65) Prior Publication Data
US 2010/0224906 A1 Sep. 9, 2010

(30) Foreign Application Priority Data
Mar. 4, 2009 (JP) ................................ 2009-050737

(51) Int. Cl.
H01L 33/56 (2010.01)
C08L 83/06 (2006.01)
(52) U.S. Cl. ................ 257/100; 257/E33.059; 525/478
(58) Field of Classification Search .................. 257/100, 257/E33.059; 525/478
See application file for complete search history.

(56) References Cited

U.S. PATENT DOCUMENTS

| | | | | |
|---|---|---|---|---|
| 3,996,195 A * | 12/1976 | Sato et al. | ......................... | 528/31 |
| 4,077,943 A * | 3/1978 | Sato et al. | ......................... | 528/15 |
| 4,427,801 A * | 1/1984 | Sweet | ............................. | 523/212 |
| 5,082,886 A * | 1/1992 | Jeram et al. | .................... | 524/403 |
| 5,198,479 A * | 3/1993 | Shiobara et al. | ............... | 523/214 |
| 6,124,407 A * | 9/2000 | Lee et al. | ........................ | 525/478 |
| 7,282,270 B2 * | 10/2007 | Morita et al. | ................... | 428/447 |
| 7,588,967 B2 * | 9/2009 | Kashiwagi | ..................... | 438/127 |
| 2005/0244649 A1* | 11/2005 | Kashiwagi et al. | ............ | 428/413 |
| 2006/0205237 A1* | 9/2006 | Kodama et al. | ................ | 438/790 |
| 2006/0270792 A1* | 11/2006 | Kashiwagi | ...................... | 524/862 |
| 2007/0077360 A1 | 4/2007 | Kashiwagi et al. | | |
| 2007/0106016 A1 | 5/2007 | Zhu | | |
| 2010/0213502 A1* | 8/2010 | Kashiwagi et al. | ............ | 257/100 |

FOREIGN PATENT DOCUMENTS

JP 2007-103494 A 4/2007

OTHER PUBLICATIONS

European Search Report for Application 10002174.0, dated Jul. 27, 2010.

\* cited by examiner

Primary Examiner — Robert S Loewe
(74) Attorney, Agent, or Firm — Birch, Stewart, Kolasch & Birch, LLP

(57) ABSTRACT

A composition for encapsulating optical semiconductors. The composition comprises (A) a mixture of a linear alkenyl group-containing organopolysiloxane and an alkenyl group-containing organopolysiloxane resin containing at least one $SiO_2$ unit, (B) a mixture of a linear organohydrogenpolysiloxane containing two or more SiH groups and a branched organohydrogenpolysiloxane that is liquid at 25° C., (C) a platinum group metal catalyst, and (D) a linear or cyclic organopolysiloxane having at least two functional groups selected from the group consisting of alkenyl groups, alkoxysilyl groups and epoxy groups bonded to silicon atoms. A cured product of the composition exhibits dramatically reduced surface tack, and therefore using the composition for encapsulating optical semiconductor elements improves the optical semiconductor device yield.

14 Claims, 2 Drawing Sheets

COMPOSITION ENCAPSULATING OPTICAL SEMICONDUCTOR AND OPTICAL SEMICONDUCTOR DEVICE USING SAME

BACKGROUND OF THE INVENTION

1. Field of the Invention

The present invention relates to an addition-curable silicone resin composition, and relates specifically to a resin composition which, by combining different organopolysiloxanes having linear, branched and resin structures, yields a cured product that exhibits minimal tack. This composition is particularly useful as an inner encapsulant for a light emitting diode (hereafter abbreviated as "LED" unless otherwise noted).

2. Description of the Prior Art

Addition-curable silicone rubber compositions form cured products that are excellent in weather resistance, heat resistance, and rubber-like properties such as hardness and elongation, and are therefore used in a wide variety of applications, including as encapsulants for LED packages. However, because these cured products tend to suffer from surface tack, various problems can arise, including adhesion of dust to the cured product surface, and unintended bonding due to the tack between packages within the parts feeder used for sorting the final products.

A hard silicone resin may be used to prevent surface tack, but the resulting cured product tends to suffer from poor shock resistance, and tends to be particularly prone to cracking when exposed to thermal shock.

Accordingly, methods that utilize the properties of both an addition-curable silicone rubber composition and a hard silicone resin have been proposed, including a method in which the strength of the cured product is improved by adding a resin-like organopolysiloxane to an addition-curable silicone rubber composition, and a method in which a resin is coated onto the cured product of an addition-curable silicone rubber composition (see Patent Documents 1 and 2). However, in the former method, the degree of tack suppression is insufficient, whereas the latter method not only requires the formation of a two-layer structure, meaning the production process is more complex, but components within the upper layer resin also tend to seep into the lower layer, changing the cured product over time.

[Patent Document 1] US2007/0077360A1
[Patent Document 2] JP 2007-103494 A

SUMMARY OF THE INVENTION

The present invention has been developed in light of the circumstances described above, and has an object of providing a composition for encapsulating an optical semiconductor that exhibits dramatically reduced tack at the cured product surface, and an optical semiconductor device in which the optical semiconductor element is encapsulated using the above composition.

As a result of intensive investigation aimed at achieving the above object, the inventors of the present invention discovered that by combining organopolysiloxanes having specific linear, branched and resin structures, the above object could be achieved. In other words, the present invention provides a composition for encapsulating an optical semiconductor that comprises components (A) to (D) described below:
(A) 100 parts by mass of an organopolysiloxane component composed of a component (A1) and a component (A2) described below, wherein the mass ratio of component (A1)/component (A2) is within a range from 50/50 to 95/5, the component (A) contains 0.005 to 0.05 mols of alkenyl groups per 100 g, and the component (A) contains not more than 0.01 mols of silanol groups per 100 g,
(A1) an alkenyl group-containing linear organopolysiloxane represented by a formula (1) shown below and having a viscosity at 25° C. of 10 to 1,000,000 mPa·s:

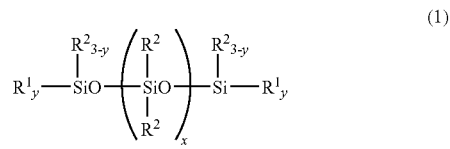

(wherein $R^1$ represents an alkenyl group, each $R^2$ independently represents an unsubstituted or substituted monovalent hydrocarbon group containing no aliphatic unsaturated bonds, x represents an integer of 0 or greater that yields a viscosity at 25° C. of 10 to 1,000,000 mPa·s, and each y independently represents an integer of 1 to 3)
(A2) an organopolysiloxane resin containing at least one $SiO_2$ unit and an alkenyl group per molecule,
(B) an organohydrogenpolysiloxane component composed of a component (B1) and a component (B2) described below, wherein the molar ratio of [SiH groups within component (B1)/SiH groups within component (B2)] is within a range from 50/50 to 90/10, and the amount of the organohydrogenpolysiloxane component yields a molar ratio of [SiH groups within the component (B)/alkenyl groups within the component (A)] within a range from 0.9 to 4,
(B1) a linear organohydrogenpolysiloxane represented by a formula (2) shown below and having two or more SiH groups per molecule:

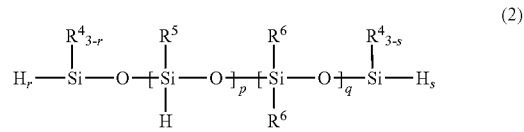

(wherein $R^4$, $R^5$ and $R^6$ each independently represents a monovalent hydrocarbon group of 1 to 10 carbon atoms, p and q each represents an integer of 0 to 100, r and s each independently represent an integer of 0 to 3, provided that p+q is an integer of 3 or greater, and p+r+s is an integer of 2 or greater)
(B2) a branched organohydrogenpolysiloxane that is liquid at 25° C.,
(C) a platinum group metal catalyst in an effective amount, and
(D) a linear or cyclic organopolysiloxane of 4 to 50 silicon atoms, having at least two functional groups selected from the group consisting of silicon atom-bonded alkenyl groups, alkoxysilyl groups and epoxy groups: in an amount within a range from 0.01 to 10 parts by mass per 100 parts by mass of the component (A).

Further, the present invention also provides an optical semiconductor device comprising an optical semiconductor element, and a layer formed of a cured product of the composition described above that covers the optical semiconductor element.

The cured product (cured resin) obtained from the composition of the present invention has reduced surface tack. Accordingly, during the production process for an optical semiconductor device, even if two or more optical semiconductor devices containing an optical semiconductor element covered with the above cured product make contact, problems such as the cured products adhering to one another, or detachment of the cured resin as a result of such adhesion, tend not to occur. As a result, the production yield and the productivity can be improved. Furthermore, because there is no need to form a two-layer structure, the process time remains short. Moreover, the cured product also exhibits favorable adhesion to the silver pads on which the optical semiconductor is mounted, meaning an optical semiconductor device prepared by encapsulating an optical semiconductor element with the composition of the present invention is able to withstand extreme reliability tests.

DETAILED DESCRIPTION OF THE PREFERRED EMBODIMENTS

Figure 1:
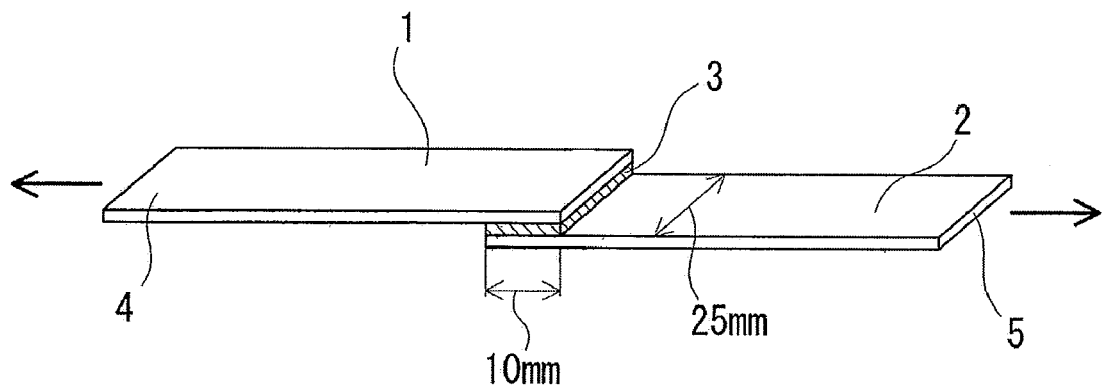
FIG. 1 is a schematic perspective view describing a method of measuring the shear adhesive strength in examples of the present invention.

Component (A) is a mixture of (A1) an alkenyl group-containing linear organopolysiloxane and (A2) an organopolysiloxane resin containing at least one $SiO_2$ unit and an alkenyl group within each molecule. The amount of alkenyl groups per 100 g of the component (A) is typically within a range from 0.005 to 0.05 mols, and preferably from 0.007 to 0.04 mols, whereas the amount of silanol groups (SiOH) per 100 g of the component (A) is within a range from 0 to 0.01 mols. If the amount of alkenyl groups is less than the lower limit of the above range, then the curing of the composition tends to be inadequate, whereas if the amount of alkenyl groups exceeds the upper limit, then the thermal shock resistance of the cured product tends to deteriorate. Furthermore, if the amount of silanol groups exceeds 0.01 mols/100 g, then the cured product tends to develop tack.

The linear organopolysiloxane (A1) has an alkenyl group of 2 to 8 carbon atoms, and preferably 2 to 6 carbon atoms, such as a vinyl group or allyl group, at both terminals. The viscosity of the organopolysiloxane, measured at 25° C. using a rotational viscometer, is typically within a range from 10 to 1,000,000 mPa·s, preferably from 100 to 100,000 mPa·s, and more preferably from 500 to 50,000 mPa·s.

The linear organopolysiloxane (A1) is preferably represented by the formula (1) shown below. The formula represents a type of composition formula, and the order in which the disiloxane units are arranged may be random. The organopolysiloxane may also include a small amount of branched structures resulting from trifunctional siloxane units within the molecular chain, provided these branched structures do not impair the object of the present invention.

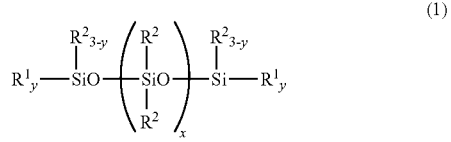

(1)

In the formula, $R^1$ represents an alkenyl group, each $R^2$ independently represents an unsubstituted or substituted monovalent hydrocarbon group containing no aliphatic unsaturated bonds, and each y independently represents an integer of 1 to 3. x represents an integer of 0 or greater that yields a viscosity within the range mentioned above.

Examples of $R^1$ include a vinyl group, allyl group, propenyl group, isopropenyl group, butenyl group, hexenyl group, cyclohexenyl group or octenyl group. Examples of $R^2$ include alkyl groups of 1 to 10 carbon atoms such as a methyl group, ethyl group, propyl group, isopropyl group, butyl group, isobutyl group, tert-butyl group, pentyl group, neopentyl group, hexyl group, cyclohexyl group, octyl group, nonyl group or decyl group; aryl groups such as a phenyl group, tolyl group, xylyl group or naphthyl group; aralkyl groups such as a benzyl group, phenylethyl group or phenylpropyl group; and groups in which some or all of the hydrogen atoms within one of the above groups have been substituted with a halogen atom such as a fluorine atom, bromine atom or chlorine atom, or a cyano group or the like, including halogenated alkyl groups such as a chloromethyl group, chloropropyl group, bromoethyl group or trifluoropropyl group, and a cyanoethyl group. Of these, $R^2$ is preferably either an alkyl group of 1 to 6 carbon atoms, and particularly a methyl group, or a phenyl group.

Examples of preferred organopolysiloxanes represented by the formula (1) include the compounds shown below.

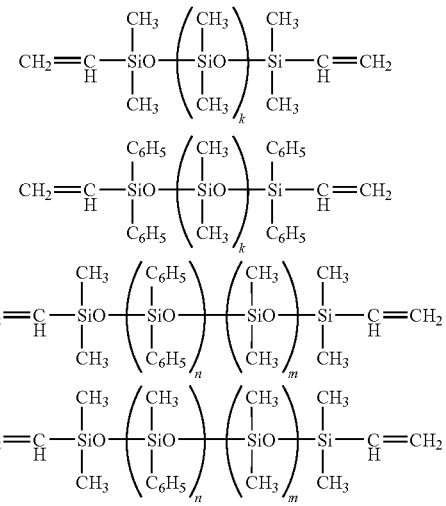

wherein each of k and n+m correspond with the aforementioned x.

The organopolysiloxane resin (A2) comprising at least one $SiO_2$ unit (Q unit) and an alkenyl group within each molecule is an organopolysiloxane that has a three dimensional network-type structure. The component (A2) is capable of including, besides Q units, M units ($R_3SiO_{1/2}$), D units ($R_2SiO_{2/2}$) and/or T units ($RSiO_{3/2}$), wherein each R represents a substituted or unsubstituted monovalent hydrocarbon group, as constituent units. Examples of the component (A2) include MQ resins and MDQ resins wherein M represents M unit and D represents D units. The amounts of Q units in the entire siloxane units in a molecule of the component (A2) preferably in a range from 1 to 70 mol %, more preferably from 2 to 60 mol %, and still more preferably from 3 to 50 mol %. The amount of alkenyl groups within the component (A2) must be such that the total amount of alkenyl groups within the combination of the components (A1) and (A2) is within a range from 0.005 to 0.05 mols, preferably from 0.01 to 0.05 mols, per 100 g of the component (A). Compounds for which the weight average molecular weight, determined by GPC and referenced against polystyrene standards, is within a range from 500 to 10,000 are preferred as this resin-like organopolysiloxane.

The component (A1) and the component (A2) are combined such that the mass ratio of (A1)/(A2) is within a range from 50/50 to 95/5, and preferably from 70/30 to 90/10. If the amount of the component (A2) is too small, then a satisfactory reduction in tack may be unattainable, whereas if the amount is too large, the viscosity of the composition tends to increase dramatically, and the cured product may become prone to cracking. Furthermore, the molar ratio between the amount of alkenyl groups within the component (A1) and the amount of alkenyl groups within the component (A2) is preferably such that (A1)/(A2) is within a range from 1/2 to 1/30, and more preferably from 1/5 to 1/15.

Component (B) is a mixture of (B1) a linear organohydrogenpolysiloxane, and (B2) a branched organohydrogenpolysiloxane. The component (B) is included in an amount that yields a molar ratio of [SiH groups within the component (B)/alkenyl groups within the component (A)] within a range from 0.9 to 4, and preferably from 1 to 2. If the amount of the component (B) yields a molar ratio that is less than the lower limit of the above range, then the composition tends to gel, whereas if the molar ratio exceeds the upper limit of the above range, then the residual SiH groups may cause the cured product to change over time.

The organohydrogenpolysiloxane (B1) contains two or more, preferably 3 to 200, more preferably 10 to 100, and most preferably 10 to 50, SiH groups per molecule. The organohydrogenpolysiloxane is represented by the formula (2) shown below.

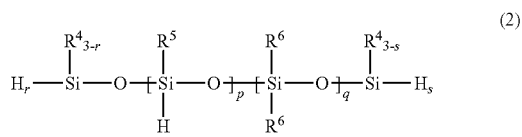

(2)

wherein $R^4$, $R^5$ and $R^6$ each independently represents a monovalent hydrocarbon group of 1 to 10 carbon atoms, p and q each represents an integer of 0 to 100, and r and s each independently represent an integer of 0 to 3, provided that p+q is an integer of 3 or greater, and p+r+s is an integer of 2 or greater. In a preferred compound, p is within a range from 20 to 100 and q=0.

Examples of the monovalent hydrocarbon group of 1 to 10 carbon atoms include the same groups as those exemplified above in relation to the substituent $R^2$ within the formula (1), including lower alkyl groups such as a methyl group and aryl groups such as a phenyl group. A methyl group is preferred. There are no particular restrictions on the positioning of the SiH groups, which may be located either at the molecular terminals or at non-terminal positions within the molecule.

Examples of the organohydrogenpolysiloxane (B1) include methylhydrogenpolysiloxane with both terminals blocked with trimethylsiloxy groups, copolymers of dimethylsiloxane and methylhydrogensiloxane with both terminals blocked with trimethylsilyoxy groups, dimethylpolysiloxane with both terminals blocked with dimethylhydrogensiloxy groups, copolymers of dimethylsiloxane and methylhydrogensiloxane with both terminals blocked with dimethylhydrogensiloxy groups, copolymers of methylhydrogensiloxane and diphenylsiloxane with both terminals blocked with trimethylsiloxy groups, and copolymers of methylhydrogensiloxane, diphenylsiloxane and dimethylsiloxane with both terminals blocked with trimethylsiloxy groups.

A branched organohydrogenpolysiloxane (B2) that is liquid at 25° C. is used in combination with the component (B1) described above. Examples of this branched organohydrogenpolysiloxane include polysiloxanes comprising $(CH_3)_2HSiO_{1/2}$ units and $SiO_{4/2}$ units, and polysiloxanes composed of $(CH_3)_2HSiO_{1/2}$ units, $SiO_{4/2}$ units, and $(C_6H_5)SiO_{3/2}$ units. The organohydrogenpolysiloxane (B2) preferably contains a $PhSiO_{1.5}$ unit (wherein Ph represents a phenyl group).

Examples of preferred organohydrogenpolysiloxanes (B2) include the compounds shown below.

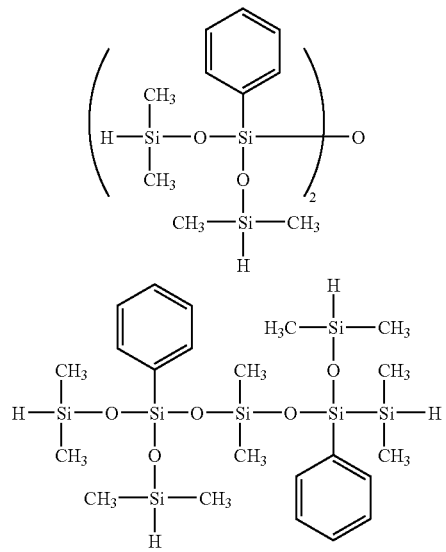

The amounts of the components (B1) and (B2) are adjusted such that the molar ratio between the respective amounts of SiH groups per component satisfies (B1)/(B2)=50/50 to 90/10, and preferably 60/40 to 80/20. If the amount of the component (B1) is too large, then the cured product tends to develop tack, whereas if the amount of the component (B1) is too small, then the adhesion of the composition to substrates and the like tends to deteriorate.

Examples of the platinum group metal catalyst (C) include platinum-based, palladium-based, and rhodium-based catalysts, although from the viewpoint of cost and the like, platinum-based catalysts of platinum, platinum black and chloroplatinic acid and the like are preferred. Specific examples include compounds such as $H_2PtCl_6.mH_2O$, $K_2PtCl_6$, $KHPtCl_6.mH_2O$, $K_2PtCl_4$, $K_2PtCl_4.mH_2O$ and $PtO_2.mH_2O$ (wherein m represents a positive integer), as well as complexes of these compounds with hydrocarbons such as olefins, alcohols, or vinyl group-containing organopolysiloxanes. These catalysts may be used either individually, or in combinations of two or more different catalysts.

The amount added of the catalyst component need only be sufficient to provide an effective catalytic action, and a typical amount, calculated as a mass of the platinum group metal relative to the combined mass of the components (A1), (A2), (B1) and (B2), is within a range from 0.1 to 1,000 ppm, with an amount from 0.5 to 200 ppm being preferred.

Component (D) is a linear or cyclic organopolysiloxane of 4 to 50 silicon atoms, having at least two functional groups selected from the group consisting of alkenyl groups, alkoxysilyl groups and epoxy groups bonded to silicon atoms. The component (D) has a function of improving the adhesion of the composition.

Examples of the component (D) include the compounds represented by the formulas shown below.

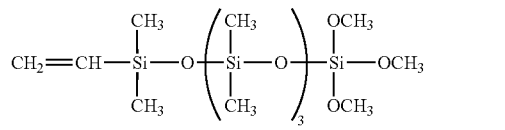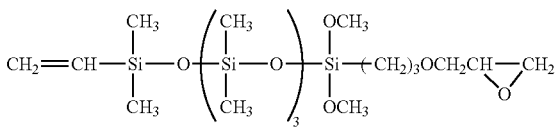
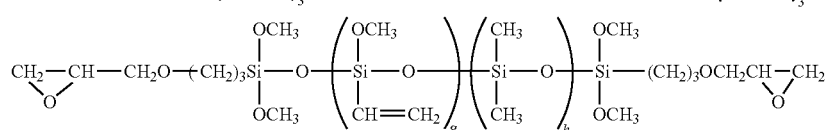
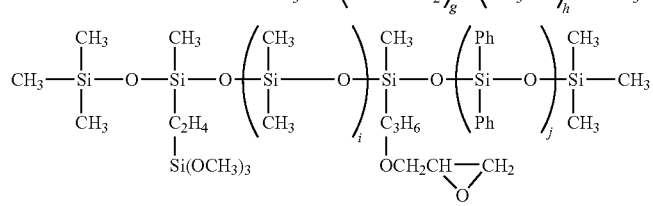

wherein g is an integer of 1 or greater and h is an integer of 0 or greater such that g+h is an integer within a range from 1 to 45, and preferably from 4 to 20; and i and j are each an integer of 0 or greater such that i+j is an integer from 1 to 45, and preferably from 4 to 20.

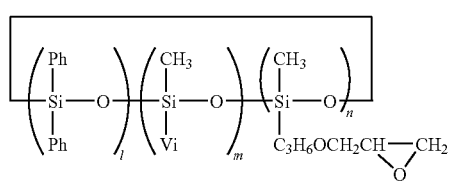
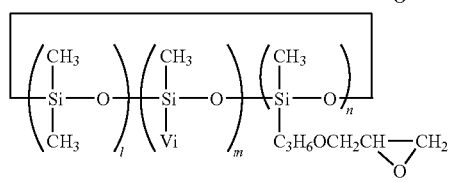
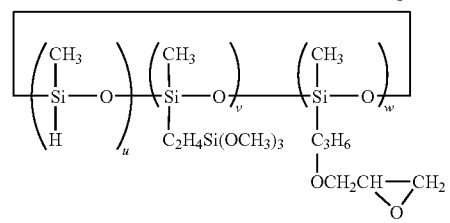

wherein m and n are each an integer of 1 or greater, and l is an integer of 0 or greater such that l+m+n is an integer within a range from 2 to 50 and preferably from 2 to 30; and u, v and w are each an integer of 0 or greater, provided that two of u, v and w are integers of 1 or greater; and Vi represents a vinyl group, and Ph represents a phenyl group.

The amount added of the component (D) is typically within a range from 0.01 to 10 parts by mass, preferably from 0.01 to 5 parts by mass, and more preferably from 0.1 to 3 parts by mass, per 100 parts by mass of the combination of the components (A). If the amount of the component (D) is too small, then the adhesion of the composition to substrates tends to be inferior, whereas an amount that is too large may have an adverse effect on the hardness or surface tack of the cured product.

In addition to the components described above, if required, the composition of the present invention may also include a variety of conventional additives. For example, reinforcing inorganic fillers such as fumed silica and fumed titanium dioxide, and non-reinforcing inorganic fillers such as calcium carbonate, calcium silicate, titanium dioxide, ferric oxide, carbon black and zinc oxide may be added to the composition in amounts that do not impair the object of the present invention.

The composition of the present invention can be prepared by mixing each of the above components uniformly together via a conventional method using a mixer or the like. In order to ensure curing does not proceed, the composition is usually stored as two separate liquids, and these two liquids are then mixed together and cured at the time of use. Needless to say, a one-pot composition containing a small amount of an added curing inhibitor such as an acetylene alcohol may also be used. In the case of a two-pot composition, the component (B) and the component (C) are separated in order to prevent the possibility of dehydrogenation reactions. The viscosity of the thus obtained composition, measured at 25° C. using a rotational viscometer, is typically within a range from 100 to 10,000,000 mPa·s, and is preferably from approximately 300 to 500,000 mPa·s.

The composition of the present invention is cured by heating, and because the cured product has a high degree of transparency and bonds extremely favorably to package materials such as polyphthalamides (PPA) and liquid crystal polymers (LCP), and to metal substrates, the composition can be widely used, not only within optical semiconductors such as LED, but also within other semiconductor packages such as photodiodes, CCD and CMOS. Although there are no particular restrictions on the curing conditions, curing is typically conducted at a temperature of 40 to 250° C., and preferably 60 to 200° C., for a period of 5 minutes to 10 hours, and preferably 30 minutes to 6 hours.

Figure 2:
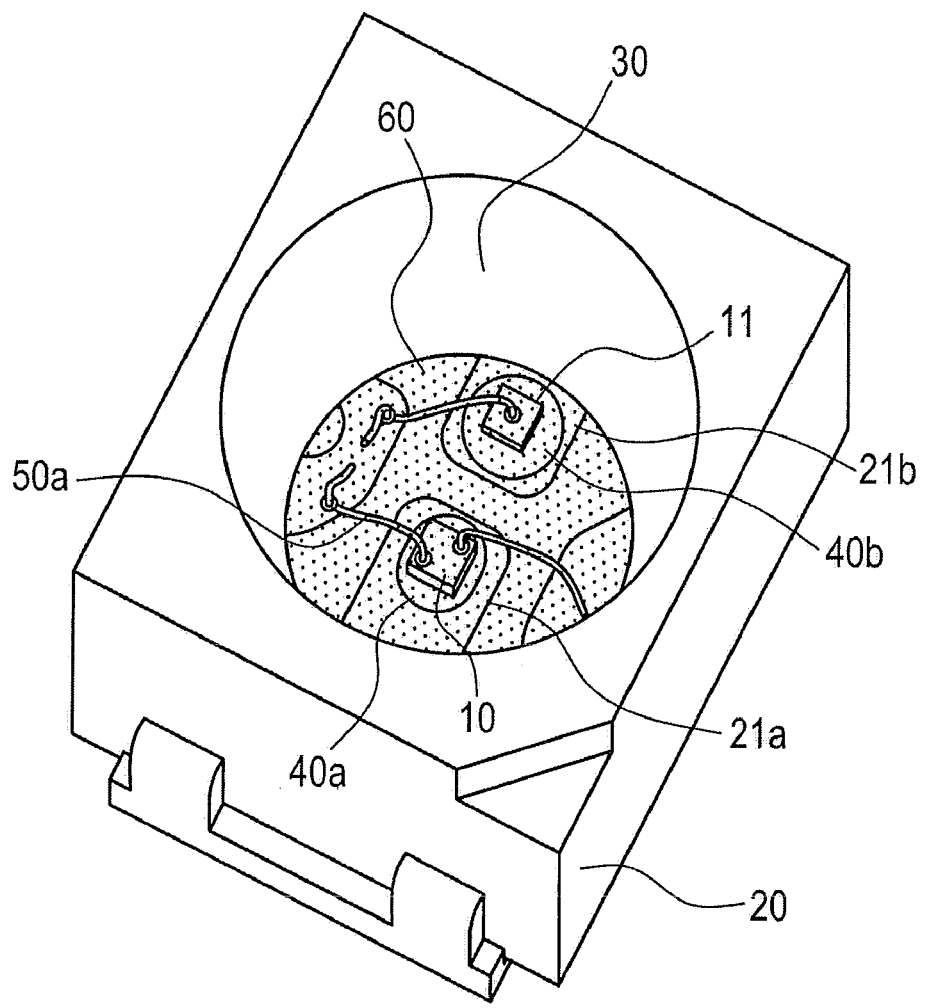
FIG. 2 is a schematic perspective view illustrating one example of an optical semiconductor device.
Figure 3:
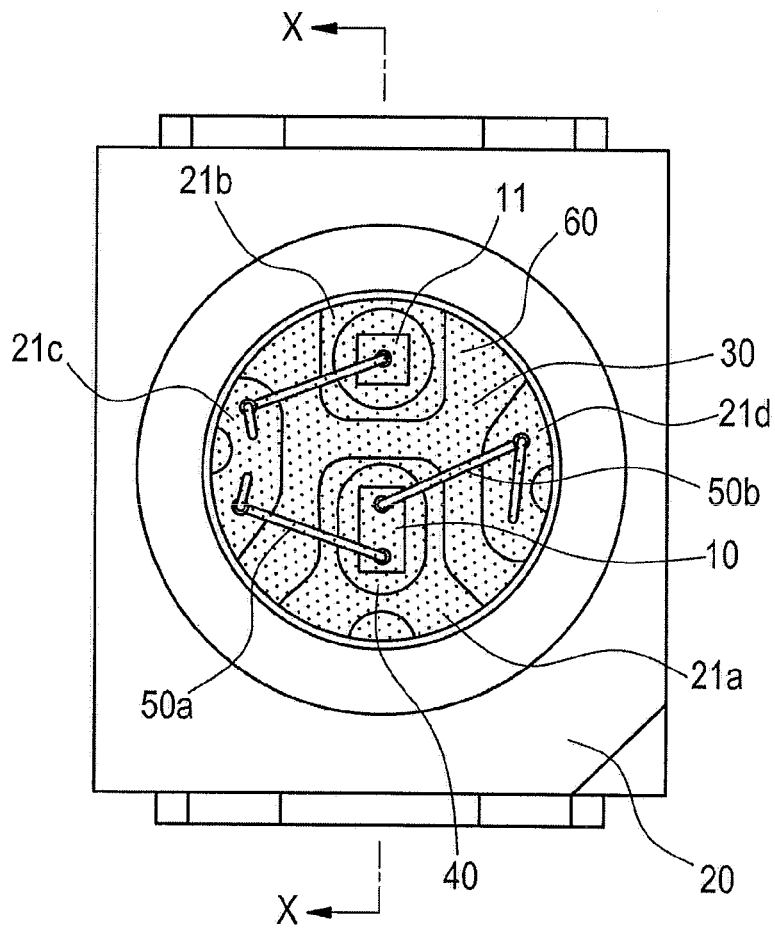
FIG. 3 is a schematic plan view illustrating one example of an optical semiconductor device.
Figure 4:
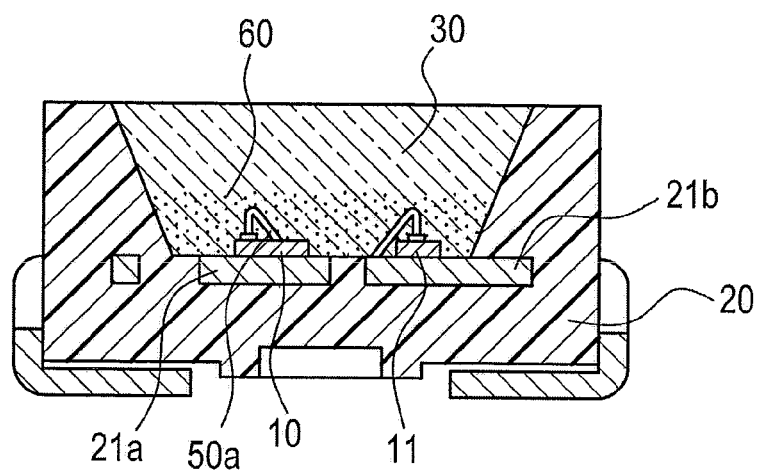
FIG. 4 is a schematic cross-sectional view illustrating one example of an optical semiconductor device.

There are no particular restrictions on the types of optical semiconductor device in which the composition of the present invention can be used, and conventional optical semiconductor devices may be used. An optical semiconductor device according to an exemplary embodiment of the present invention is described below with reference to the drawings. FIG. 2 is a schematic perspective view illustrating one example of an optical semiconductor device, and FIG. 3 is a schematic plane view of the device. FIG. 4 is a schematic cross-sectional view along the line X-X of the optical semiconductor device illustrated in FIG. 3. The optical semiconductor device comprises an optical semiconductor element 10, a package 20 inside which the optical semiconductor element 10 is mounted, and an encapsulating member 30 that covers the optical semiconductor element 10. The package 20 has conductive leads 21 (specifically, four leads 21a, 21b, 21c and 21d). The package 20 has a cup-shaped depression having a bottom surface and a side surface, and the surfaces of the leads 21 are exposed at the bottom surface of the depression. The leads 21 are formed of silver or a silver-containing alloy or a base material such as iron or copper with a surface plated with silver. The optical semiconductor element 10 is connected to lead 21a via a die bonding member 40 (not shown in FIG. 4 because of being a thin layer), is connected to another lead 21c via a wire 50a, and is connected to lead 21d via a wire 50b. A protective element 11 such as a zener may be mounted on another lead 21b. The addition-curable silicone resin composition according to the present invention is used for the encapsulating member 30, and is injected into the interior of the cup-like shape of the package 20 and subsequently cured. The encapsulating member 30 may also contain a fluorescent material 60 that absorbs the light from the optical semiconductor element 10 and alters the wavelength of the light.
(Optical Semiconductor Element)

Examples of the optical semiconductor element include blue light-emitting LED chips formed from a gallium nitride (GaN) based semiconductor, and ultraviolet light-emitting LED chips and the like. In addition, elements prepared by using a MOCVD method or the like to form a light emitting layer of a nitride semiconductor such as InN, AlN, InGaN, AlGaN or InGaAlN on top of a substrate may also be used. Either a face-up mounted optical semiconductor element or a flip-chip mounted optical semiconductor element may be used. Furthermore, the optical semiconductor element illustrated in the drawings represents an example of an optical semiconductor element in which the n-side electrode and the p-side electrode are disposed on the same surface, but optical semiconductor elements in which the n-side electrode is provided on one surface and the p-side electrode is provided on the opposing surface can also be used.
(Package)

In the above package, the pair of leads is integrally molded as part of the package, but different embodiments in which the package is first molded, and plating or the like is then used to provide circuit wiring on the package may also be used. The package may adopt any of a wide variety of shapes, including a flat plate-like shape or a cup-like shape. The package is provided with leads that supply an external electrical current to the optical semiconductor element, and is preferably formed from an electrically insulating material with excellent light resistance and heat resistance. Examples of the package material include thermoplastic resins such as polyphthalamide resins, thermosetting resins such as epoxy resins, as well as glass epoxy resins and ceramics. Further, in order to ensure efficient reflection of the light from the optical semiconductor element, a white pigment such as titanium oxide may be mixed into the resin that constitutes the package. In those cases where the package is molded using a resin, the leads that supply electrical power to the optical semiconductor element mounted on the bottom surface inside the cup-like shape can be formed comparatively easily by insert molding, injection molding, extrusion molding or transfer molding or the like.
(Leads)

The leads are exposed at the bottom surface inside the cup-like shape of the package, are connected electrically to the optical semiconductor element, and, for example, may be plate-like leads that are inserted within the package, or a conductive pattern that is formed on the package surface. Accordingly, the leads may be formed of any material capable of performing the function of forming an electrical connection with the optical semiconductor element to achieve conduction, although forming the leads from a material having a comparatively high thermal conductivity is preferred. Specific examples of preferred materials include materials obtained by plating the surface of a metal such as copper, aluminum, gold, tungsten, iron or nickel, or an iron-nickel alloy, phosphor-bronze or iron-containing copper, with either silver or a silver-containing alloy. Elemental silver or alloys containing silver may also be used. The light reflection efficiency of the silver exposed at the surface of the leads deteriorates upon corrosion. Accordingly, the surfaces of the leads must be coated with a coating member to ensure that those portions that are irradiated either directly or indirectly with the light from the optical semiconductor element are able to maintain a high degree of reflectance.
(Encapsulating Member)

The encapsulating member has the functions of efficiently transmitting the light from the optical semiconductor element into the external environment, as well as protecting the optical semiconductor element and the wires and the like from external forces and dust and the like. The silicone resin according to the present invention is used as the encapsulating member. The encapsulating member may include a fluorescent material or a light diffusion member or the like.
(Fluorescent Material)

There are no particular restrictions on the fluorescent material, which may be any material capable of absorbing the light emitted from the optical semiconductor element and converting the wavelength of the light to a different wavelength. For example, at least one material selected from amongst nitride-based phosphors or oxynitride-based phosphors activated mainly with lanthanoid elements such as Eu or Ce, alkaline earth halogen apatite phosphors, alkaline earth metal halogen borate phosphors, alkaline earth metal aluminate phosphors, alkaline earth silicate phosphors, alkaline earth sulfide phosphors, alkaline earth thiogallate phosphors, alkaline earth silicon nitride phosphors and germanate phosphors activated mainly with lanthanoid elements such as Eu or transition metal elements such as Mn, rare earth aluminate phosphors and rare earth silicate phosphors activated mainly with lanthanoid elements such as Ce, and organic or organic complex phosphors activated mainly with lanthanoid elements such as Eu is preferred. Specific examples of fluorescent materials that may be used favorably include $(Y,Gd)_3(Al,Ga)_5O_{12}:Ce$, $(Ca,Sr,Ba)_2SiO_4:Eu$, $(Ca,Sr)_2Si_5N_8:Eu$ and $CaAlSiN_3:Eu$.

EXAMPLES

The present invention is described in more detail below on the basis of a series of Examples and Comparative Examples, although the present invention is in no way limited by the Examples presented below. In the following description, Vi represents a vinyl group.

Example 1

To 87.5 g of a polysiloxane represented by a formula (1) shown below (viscosity at 25° C.: 5,000 mPa·s, hereafter referred to as "VF"):

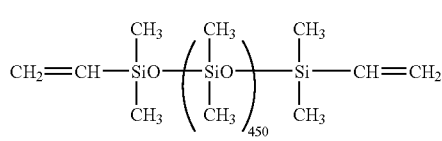

were added 12.5 g of a resin structure vinylmethylsiloxane (hereafter referred to as "VMQ") composed of 50 mol % of $SiO_2$ units, 42.5 mol % of $(CH_3)_3SiO_{0.5}$ units and 7.5 mol % of $Vi_3SiO_{0.5}$ units (total vinyl group content per 100 g of VF and VMQ in total=0.0162 mols), 1.2 g of an organohydrogensiloxane represented by a formula (ii) shown below:

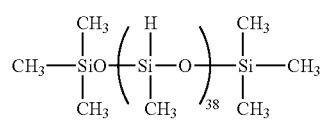

and 0.6 g of an organohydrogensiloxane represented by a formula (iii) shown below:

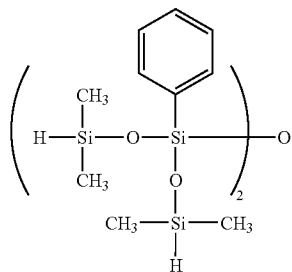

thereby providing a total SiH group content equivalent to 1.5 mols per 1 mol of vinyl groups within the combination of the aforementioned VF and VMQ components, 0.05 g of an octyl alcohol-modified chloroplatinic acid solution (platinum concentration: 2% by mass), and 1.5 g of an oligomer represented by a formula (Iv) shown below:

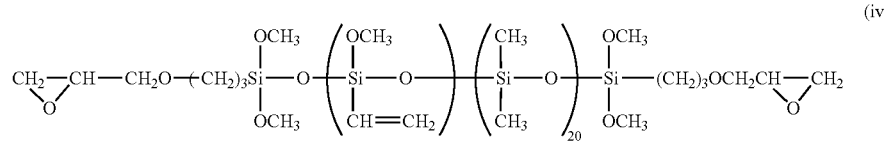
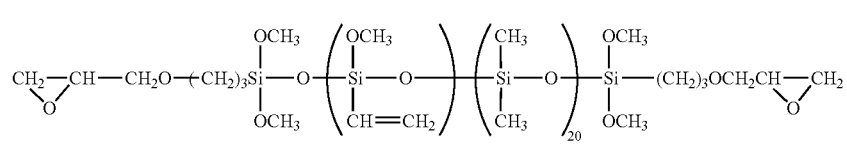

and the resulting mixture was mixed thoroughly, thereby completing preparation of a composition.

Example 2

With the exceptions of using 70 g of VF and 30 g of VMQ (total vinyl group content per 100 g of both components=0.0310 mols), and using 2.25 g of the organohydrogensiloxane represented by the formula (ii) and 1.1 g of the organohydrogensiloxane represented by the formula (iii) in order to provide a total SiH group content equivalent to 1.5 mols per 1 mol of vinyl groups within the combination of VF and VMQ components, a composition was prepared in the same manner as Example 1.

Example 3

With the exceptions of using 92 g of VF and 8 g of VMQ (total vinyl group content per 100 g of both components=0.0124 mols), and using 0.91 g of the organohydrogensiloxane represented by the formula (ii) and 0.49 g of the organohydrogensiloxane represented by the formula (iii) in order to provide a total SiH group content equivalent to 1.5 mols per 1 mol of vinyl groups within the combination of VF and VMQ components, a composition was prepared in the same manner as Example 1.

Comparative Example 1

Using 87.5 g of VF and 12.5 g of VMQ (total vinyl group content per 100 g of both components=0.0162 mols) in a similar manner to Example 1, but with the exception of using 1.5 g of the organohydrogensiloxane represented by the formula (ii) but none of the organohydrogensiloxane represented by the formula (iii) in order to provide a total SiH group content equivalent to 1.5 mols per 1 mol of vinyl groups within the combination of VF and VMQ components, a composition was prepared in the same manner as Example 1.

Comparative Example 2

With the exceptions of using 70 g of VF and 30 g of VMQ (total vinyl group content per 100 g of both components=0.0310 mols), and using 2.82 g of the organohydrogensiloxane represented by the formula (ii) but none of the organohydrogensiloxane represented by the formula (iii) in order to provide a total SiH group content equivalent to 1.5 mols per 1 mol of vinyl groups within the combination of VF and VMQ components, a composition was prepared in the same manner as Example 1.

Comparative Example 3

With the exceptions of using 70 g of VF and 30 g of VMQ (total vinyl group content per 100 g of both components=0.0310 mols), and using 1.4 g of the organohydrogensiloxane represented by the formula (ii) and 3.1 g of the organohydrogensiloxane represented by the formula (iii) in order to provide a total SiH group content equivalent to 1.5 mols per 1 mol of vinyl groups within the combination of VF and VMQ components, a composition was prepared in the same manner as Example 1.

Comparative Example 4

With the exceptions of using 100 g of VF (vinyl group content per 100 g=0.0057 mols) but using no VMQ, and using 0.52 g of the organohydrogensiloxane represented by the formula (ii) and 0.23 g of the organohydrogensiloxane represented by the formula (iii) in order to provide a total SiH group content equivalent to 1.5 mols per 1 mol of vinyl groups within the VF component, a composition was prepared in the same manner as Example 1.

Comparative Example 5

With the exceptions of using 45 g of VF and 55 g of VMQ (total vinyl group content per 100 g of both components=0.0521 mols), and using 4.358 g of the organohydrogensiloxane represented by the formula (ii) and 1.89 g of the organohydrogensiloxane represented by the formula (iii) in order to provide a total SiH group content equivalent to 1.5 mols per 1 mol of vinyl groups within the combination of VF and VMQ components, a composition was prepared in the same manner as Example 1.

Each of the compositions was evaluated using the methods described below. The curing conditions involved heating at 150° C. for 4 hours. The results of the evaluations are listed in Table 1.

[External Appearance]

A 1 mm thick cured product was prepared, and the external appearance was evaluated by visual inspection.

[Light Transmittance (%)]

A 1 mm thick cured product was prepared, and the light transmittance (%) of the product at 450 nm was measured using a spectrophotometer.

[Refractive Index $n_{D25}$]

An Abbe refractometer was used to measure the refractive index of the composition at 25° C. relative to sodium-D light.

[Hardness, Tensile Strength, Elongation]

The hardness was measured using a type-A spring tester, and the tensile strength and elongation were measured in accordance with JIS K 6301.

[Measurement of PPA Shear Adhesive Strength]

As illustrated in FIG. 1, two substrate pieces 1 and 2 formed from PPA (polyphthalamide resin) strips of width 25 mm were bonded together by overlapping the ends of the two pieces to a length of 10 mm with a 1 mm thick composition layer 3, provided between the overlapped ends, and then curing the composition layer 3 by heating for 4 hours at 150° C. The resulting specimen was left to stand at room temperature for at least 12 hours, and the tensile shear adhesive strength was then measured by using a tensile tester to pull the two ends 4 and 5 of the specimen in the directions indicated by the arrows.

[Measurement of Cohesive Failure Rate]

The fractured surface of the specimen following measurement of the shear adhesive strength in the manner described above was evaluated by determining the ratio of the surface area across which cohesive failure occurred (that is, those areas where the PPA substrate pieces and the cured product of the composition did not undergo interface separation, but rather the cured product itself fractured) relative to the total surface area of the fractured surface, and this ratio (as a percentage) was recorded as the cohesive failure rate.

[Measurement of Tack of Semiconductor Device]

A commercially available top view light emitting device (NECW017 (product number), manufactured by Nichia Corporation) was used as an optical semiconductor device. This optical semiconductor device had a substantially cuboid shape with dimensions of length 3.5 mm×width 2.8 mm×height 2.0 mm. The package included a substantially circular cup-like shape with a diameter of approximately 2.5 mm in a plan view. By injecting the composition into the cup-like shape and performing curing under conditions involving heating at 150° C. for 4 hours, 1,500 optical semiconductor devices were prepared. All 1,500 of these optical semiconductor devices were packed inside an aluminum bag of predetermined size, and left to stand for one month at ambient temperature. Subsequently, the devices were taken out of the bag, and the number of optical semiconductor devices in which the encapsulating member of one optical semiconductor device had adhered to the encapsulating member of another optical semiconductor device, in which detachment of the encapsulating member had occurred as a result of such adhesion, or in which some form of damage had occurred on the upper surface of the encapsulating member was counted. The results are detailed in Table 2.

[High Humidity Reflow Test of Semiconductor Package]

20 devices prepared in the same manner as that described for the above tack evaluation were left to stand for 168 hours in an atmosphere at 30° C. and 70% RH to allow thorough moisture absorption. The devices were subsequently passed through a reflow oven at 260° C., and were then inspected under a microscope for the occurrence of detachment or cracking. Devices in which detachment or cracking was observed were recorded as failures. The results are listed in Table 3.

TABLE 1

|  | Example 1 | Example 2 | Example 3 | Comparative Example 1 | Comparative Example 2 | Comparative Example 3 | Comparative Example 4 | Comparative Example 5 |
| --- | --- | --- | --- | --- | --- | --- | --- | --- |
| SiH/SiVi (molar ratio) | 1.5 | 1.5 | 1.5 | 1.5 | 1.5 | 1.5 | 1.5 | 1.5 |
| External appearance | Colorless, transparent | Colorless, transparent | Colorless, transparent | Colorless, transparent | Colorless, transparent | Colorless, transparent | Colorless, transparent | Colorless, transparent |
| Light transmittance (%) | 98 | 98 | 98 | 98 | 98 | 98 | 98 | 98 |
| Refractive index $n_{D25}$ | 1.41 | 1.41 | 1.41 | 1.41 | 1.41 | 1.41 | 1.41 | 1.41 |
| Hardness (Type A) | 35 | 58 | 25 | 34 | 57 | 56 | 15 | 75 |
| Elongation (%) | 130 | 130 | 130 | 130 | 150 | 160 | 180 | 80 |
| Tensile strength (MPa) | 1.2 | 3 | 0.5 | 1.2 | 3 | 2.6 | 0.5 | 8 |
| PPA shear adhesive strength (MPa) | 0.5 | 1.6 | 0.3 | 0.6 | 1.6 | 1.5 | 0.1 | 6 |
| Cohesive failure rate (%) | 100 | 100 | 100 | 100 | 100 | 100 | 100 | 50 |

TABLE 2

| | Example 1 | Example 2 | Example 3 | Comparative Example 1 | Comparative Example 2 | Comparative Example 3 | Comparative Example 4 | Comparative Example 5 |
|---|---|---|---|---|---|---|---|---|
| Tack test Number of failures | 0 | 0 | 0 | 26 | 17 | 0 | 33 | 0 | n = 1,500

TABLE 3

| | Example 1 | Example 2 | Example 3 | Comparative Example 1 | Comparative Example 2 | Comparative Example 3 | Comparative Example 4 | Comparative Example 5 |
|---|---|---|---|---|---|---|---|---|
| High-humidity reflow test Number of failures | 0 | 0 | 0 | 0 | 0 | 13 | 0 | 18 | n = 20

As is evident from Tables 2 and 3, the cured products obtained from the compositions of Comparative Examples 1 and 2 that lacked the component (B2), and the cured product obtained from the composition of Comparative Example 4 that lacked the component (A2) all exhibited surface tack. The cured product obtained from the composition of Comparative Example 3 in which the component (B2) was included in a larger amount than the component (B1), and the cured product obtained from the composition of Comparative Example 5 in which the component (A2) was included in a larger amount than the component (A1) exhibited poor heat resistance. In contrast, the semiconductor devices obtained using the compositions of the present invention suffered no surface tack, and exhibited excellent thermal shock resistance.

The composition of the present invention is useful as an encapsulant for all manner of optical semiconductor elements, including light receiving elements, photodiodes, phototransistors, optical sensors and laser diodes.

What is claimed is:

1. A composition for encapsulating an optical semiconductor, comprising:
   (A) 100 parts by mass of an organopolysiloxane component composed of a component (A1) and a component (A2) described below, wherein a mass ratio of component (A1)/component (A2) is within a range from 50/50 to 95/5, the component (A) contains 0.005 to 0.05 mols of alkenyl groups per 100 g, and the component (A) contains not more than 0.01 mols of silanol groups per 100 g,
   (A1) an alkenyl group-containing linear organopolysiloxane represented by a formula (1) shown below and having a viscosity at 25° C. of 10 to 1,000,000 mPa·s:

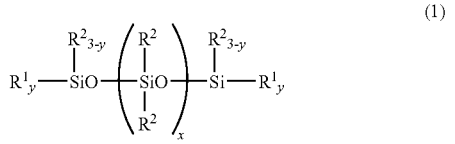

wherein $R^1$ represents an alkenyl group, each $R^2$ independently represents an unsubstituted or substituted monovalent hydrocarbon group containing no aliphatic unsaturated bonds, x represents an integer of 0 or greater that yields a viscosity at 25° C. of 10 to 1,000,000 mPa·s, and each y independently represents an integer of 1 to 3,
   (A2) an organopolysiloxane resin comprising at least one $SiO_2$ unit and an alkenyl group within each molecule,
(B) an organohydrogenpolysiloxane component composed of a component (B1) and a component (B2) described below, wherein a molar ratio of [SiH groups within component (B1)/SiH groups within component (B2)] is within a range from 50/50 to 90/10, and an amount of the organohydrogenpolysiloxane component yields a molar ratio of [SiH groups within component (B)/alkenyl groups within component (A)] within a range from 0.9 to 4,
   (B1) a linear organohydrogenpolysiloxane represented by a formula (2) shown below and having two or more SiH groups per molecule:

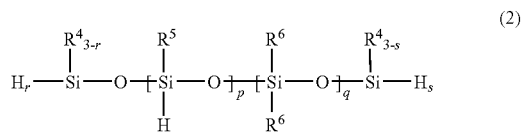

wherein $R^4$, $R^5$ and $R^6$ each independently represents a monovalent hydrocarbon group of 1 to 10 carbon atoms, p and q each represents an integer of 0 to 100, r and s each independently represent an integer of 0 to 3, provided that p+q is an integer of 3 or greater, and p+r+s is an integer of 2 or greater,
   (B2) a branched organohydrogenpolysiloxane that is liquid at 25° C.,
(C) a platinum group metal catalyst in an effective amount, and
(D) a linear or cyclic organopolysiloxane of 4 to 50 silicon atoms, having at least two functional groups selected from the group consisting of silicon atom-bonded alkenyl groups, alkoxysilyl groups and epoxy groups: in an amount within a range from 0.01 to 10 parts by mass per 100 parts by mass of the component (A).

2. The composition according to claim 1, wherein the component (A) contains 0.007 to 0.04 mols of alkenyl groups per 100 g thereof.

3. The composition according to claim 1, wherein the linear organopolysiloxane of the component (A1) has alkenyl groups of 2 to 8 carbon atoms at both terminal ends.

4. The composition according to claim 1, wherein the linear organopolysiloxane of the component (A1) has a viscosity at 25° C. of 100 to 100,000 mPa·s.

5. The composition according to claim 1, wherein the component (A2) contains $SiO_2$ units in an amount of 1 mol % to 70 mol % of the entire siloxane units contained in the component.

6. The composition according to claim 1, wherein the component (A2) contains at least two alkenyl groups per molecule.

7. The composition according to claim 1, wherein the mass ratio of the component (A1)/component (A2) is in a range from 70/30 to 90/10.

8. The composition according to claim 1, wherein the molar ratio of alkenyl groups within the component (A1) to alkenyl groups within the component (A2) is within a range from 1/2 to 1/30.

9. The composition according to claim 1, wherein a molar ratio of [SiH groups within the component (B)/alkenyl groups within the component (A)] is within a range from 1 to 2.

10. The composition according to claim 1, wherein the organohydrogenpolysiloxane of the component (B1) contains at least two SiH groups per molecule.

11. The composition according to claim 1, wherein the organohydrogenpolysiloxane of the component (B1) is represented by the formula (2):

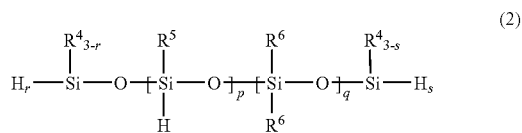

wherein $R^4$, $R^5$ and $R^6$ each independently represents a monovalent hydrocarbon group of 1 to 10 carbon atoms, p and q each represents an integer of 0 to 100, and r and s each independently represent an integer of 0 to 3, provided that p+q is an integer of 3 or greater, and p+r+s is an integer of 2 or greater.

12. The composition according to claim 1, wherein the molar ratio of [SiH groups within component (B1)/SiH groups within component (B2)] is within a range from 60/40 to 80/20.

13. An optical semiconductor device, comprising an optical semiconductor element, and a layer formed of a cured product of a composition defined in claim 1 that covers the optical semiconductor element.

14. The optical semiconductor device according to claim 13, wherein the optical semiconductor element is a light emitting diode.

* * * * *

UNITED STATES PATENT AND TRADEMARK OFFICE
CERTIFICATE OF CORRECTION

PATENT NO.         : 8,373,196 B2
APPLICATION NO.    : 12/716823
DATED              : February 12, 2013
INVENTOR(S)        : Tsutomu Kashiwagi et al.

It is certified that error appears in the above-identified patent and that said Letters Patent is hereby corrected as shown below:

On the Title Page, at item (54), and in the specifications, at column 1, lines 1-3, correct the title of the invention to read as follows: --COMPOSITION FOR ENCAPSULATING OPTICAL SEMICONDUCTOR AND OPTICAL SEMICONDUCTOR DEVICE USING SAME--.

Signed and Sealed this
Fourth Day of June, 2013

Teresa Stanek Rea
*Acting Director of the United States Patent and Trademark Office*